(12) United States Patent
Asuri et al.

(10) Patent No.: US 7,561,619 B2
(45) Date of Patent: Jul. 14, 2009

(54) FEEDBACK FILTER

(75) Inventors: Bhushan Asuri, Oak Park, CA (US); Anush A. Krishnaswami, Los Angeles, CA (US); William J. Chimitt, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 594 days.

(21) Appl. No.: 10/741,029

(22) Filed: Dec. 19, 2003

(65) Prior Publication Data

US 2005/0135467 A1 Jun. 23, 2005

(51) Int. Cl.
*H03H 7/30* (2006.01)

(52) U.S. Cl. .............. 375/233; 375/229; 375/232; 375/234; 379/340; 379/398; 381/103; 708/322; 708/323

(58) Field of Classification Search ............... 375/232, 375/233, 316, 332, 229, 265; 714/795; 709/236; 398/58; 703/25
See application file for complete search history.

(56) References Cited

U.S. PATENT DOCUMENTS

| | | | |
|---|---|---|---|
| 4,281,411 A * | 7/1981 | Bonn et al. | 375/232 |
| 4,419,756 A | 12/1983 | Cheng-Quispe et al. | |
| 4,694,341 A | 9/1987 | Soneda et al. | |
| 4,904,952 A | 2/1990 | Tanimoto | |
| 5,088,106 A | 2/1992 | Kitamura et al. | |
| 5,321,723 A | 6/1994 | Mizoguchi | |
| 5,345,452 A * | 9/1994 | Matui | 714/795 |
| 5,384,501 A | 1/1995 | Koyama et al. | |
| 5,394,022 A | 2/1995 | Murakami et al. | |
| 5,461,335 A | 10/1995 | Tsuchiya | |
| 5,560,038 A * | 9/1996 | Haddock | 709/236 |
| 5,594,576 A * | 1/1997 | Sutherland et al. | 398/58 |
| 5,696,769 A | 12/1997 | Choi et al. | |
| 5,721,756 A | 2/1998 | Liebetreu et al. | |
| 5,757,855 A | 5/1998 | Strolle et al. | |
| 5,809,086 A * | 9/1998 | Ariyavisitakul | 375/332 |
| 5,818,544 A | 10/1998 | Han | |

(Continued)

FOREIGN PATENT DOCUMENTS

EP 0701350 A2 3/1996

(Continued)

OTHER PUBLICATIONS

*International Search Report*, Dated Apr. 26, 2005, PCT/US2004/041106, 5 PAges.

(Continued)

*Primary Examiner*—David C Payne
*Assistant Examiner*—Adolf Dsouza
(74) *Attorney, Agent, or Firm*—Grossman, Tucker, Perreault & Pfleger, PLLC

(57) ABSTRACT

Disclosed are a system, method and device for generating an equalized signal from an input signal. Symbols in the equalized signal may be detected on each of a sequence of symbol intervals to recover a symbol value in the symbol interval. A feedback coefficient may be applied to a symbol value recovered in a previous symbol interval to generate the equalized signal in a current symbol interval. The feedback coefficient may be generated based, at least in part, on an estimated error associated with the equalized signal. The estimated error associated with the equalized output signal from among a plurality of candidate estimated error values.

23 Claims, 5 Drawing Sheets

U.S. PATENT DOCUMENTS

| | | | |
|---|---|---|---|
| 5,822,143 | A | 10/1998 | Cloke et al. |
| 6,072,699 | A | 6/2000 | Horine |
| 6,192,072 | B1 | 2/2001 | Azadet et al. |
| 6,608,864 | B1 | 8/2003 | Strait |
| 7,301,998 | B2 | 11/2007 | Asuri et al. |
| 7,352,826 | B2 | 4/2008 | Krishnaswami |
| 2002/0021767 | A1* | 2/2002 | Greiss et al. ............... 375/316 |
| 2002/0122480 | A1* | 9/2002 | Abnous et al. .............. 375/233 |
| 2002/0122503 | A1* | 9/2002 | Agazzi ....................... 375/316 |
| 2002/0150155 | A1 | 10/2002 | Florentin et al. |
| 2003/0217215 | A1 | 11/2003 | Taborek, Sr. et al. |
| 2003/0220781 | A1* | 11/2003 | Salmonsen et al. ............ 703/25 |
| 2005/0134349 | A1 | 6/2005 | Krishnaswami |
| 2005/0134350 | A1 | 6/2005 | Huang et al. |
| 2005/0135467 | A1 | 6/2005 | Asuri et al. |
| 2005/0135468 | A1 | 6/2005 | Asuri et al. |
| 2005/0135473 | A1 | 6/2005 | Asuri et al. |

FOREIGN PATENT DOCUMENTS

| | | |
|---|---|---|
| EP | 0751653 | 1/1997 |
| EP | 0756404 A2 | 1/1997 |
| EP | 1146709 | 10/2001 |
| TW | 0455840 | 9/2001 |
| WO | 9727695 A2 | 7/1997 |
| WO | 0108373 A2 | 2/2001 |
| WO | 2003058791 A2 | 7/2003 |
| WO | 2005067143 A2 | 7/2005 |
| WO | 2005067143 A3 | 7/2005 |
| WO | 2005067236 A1 | 7/2005 |
| WO | 2005067237 | 7/2005 |

OTHER PUBLICATIONS

*Written Opinion of the International Searching Authority*, Dated Apr. 26, 2005, PCT/US2004/041106, 7 Pages.

Fang, L., et al., "A 60-MBaud, 480-MBit/S, 256-QAM Decision-Feedback Equalizer in 1.2-Mu M CMOS", *Proceedings of the Custom Integrated Circuits Conference*, 14, IEEE, US,(May 3, 1992),2911-2912.

Wong, Caesar S., et al., "A 50 Mhz Eight-Tap Adaptive Equalizer for Partial-Response Channels", 8107 IEEE Journal of Solid-State Circuits, 30(3), (Mar. 1, 1995),228-234.

T., Yost et al., "MMIC and Fiber Optic Delay Line Hybrid Transversal Filter", SBMO/IEEE MMT-S IMOC '95 Proceedings, Drexel University, Philadelphia, PA, 1995,46-51.

International Search Report and Written Opinion of the International Searching; Dated Jul. 6, 2005; PCT/US2004/041109; 21 pages.

Office Action for U.S. Appl. No. 10/741,039 mailed Feb. 8, 2007.

International Search Report and Written Opinion of the International Searching Authority; Dated Jul. 20, 2005; PCT/US2004/041103, 24 pages.

Office Action for U.S. Appl. No. 10/741,001 mailed Feb. 23, 2007.

Office Action for U.S. Appl. No. 10/741,044 mailed Jan. 19, 2005.

Office Action for U.S. Appl. No. 10/741,044 mailed Jul. 5, 2005.

Office Action for U.S. Appl. No. 10/741,044 mailed Oct. 26, 2005.

Office Action for U.S. Appl. No. 10/741,044 mailed Apr. 11, 2006.

English Translation of Office action for Japanese Application No. 93138553 mailed Aug. 24, 2007.

Office Action for Japanese Application No. 093138554 mailed Aug. 24, 2007 and English Translation.

Office Action for U.S. Appl. No. 10/742,119 mailed Mar. 6, 2007, 17 pgs.

Stojanovic, M. et al., "Hypothesis-Feedback Equalization for Direct-Sequence Spread-Spectrum Underwater Communications", Oceans 2000 MTS/IEEE Conference and Exhibition, 1, (Sep. 11, 2000),123-128.

Raghunath, R. K., "Staggered Transpose Form Equalizer Using A RAM (RAM-EQ)", Signals, Systems & Computers, 1999 Conf. Record of the Thitry-third Asilomar Conf, vol. 1, IEEE 1999,(Oct. 24, 1999),115-119.

Haar, S. et al., "Equalizer-Based Symbol-Rate Timing Recovery for Digital Subscriber Line Systems", Globecom'02-2002-IEEE Global Telecommunications Conf., vol. 1 of 3, IEEE 2002,(Nov. 17, 2002),312-316.

Invitation to Pay Additional Fees and Partial International Search Report, Dated May 2, 2005, PCT/US2004/041109.

Invitation to Pay Additional Fees and Partial International Search Report, Dated May 3, 2005, PCT/US2004/041103.

Karaoguz, J. et al., "A Soft Decision-Directed Blind Equalization Algorithm Applied to Equalization of Mobile Communication Channels", Proceedings of the International Conference on Communications,IEEE, US, vol. 4, (Jun. 14, 1992),1272-1276.

Office Action Received for Taiwanese Patent Application No. 93138554, mailed (Feb. 27, 2008), 13 pgs.

Notice of Allowance Received for U.S. Appl. No. 10/742,119, mailed (Jun. 26, 2007), 6 pgs.

Notice of Allowance Received for U.S. Appl. No. 10/741,001, mailed (Sep. 19, 2007), 7 pgs.

Office Action Received for U.S. Appl. No. 10/741,039, mailed (Jul. 18, 2007), 19 pgs.

Office Action Received for U.S. Appl. No. 10/741,039, mailed (Apr. 15, 2008), 19 pgs.

* cited by examiner

FEEDBACK FILTER

RELATED MATTERS

The subject matter disclosed herein relates to U.S. patent application Ser. Nos. 10/741,001, 10/741,044, 10/741,039 and 10/742,119, filed concurrently with the present application and incorporated herein by reference.

BACKGROUND

1. Field

The subject matter discloses herein relates to devices and methods of processing data received from a transmission medium. In particular, the subject matter disclosed herein relates to processing signals received from a communication channel in the presence of noise and distortion.

2. Information

To recover information from a signal received from noisy communication channel with distortion, receivers typically employ filtering and equalization techniques to enable reliable detection of the information. Decreases in the cost of digital circuitry have enabled the cost effective use of adaptive digital filtering and equalization techniques that can optimally "tune" a filter according to the specific characteristics of a noisy communication channel with distortion.

FIG. 1 shows a conventional digital filter 10 employing a finite impulse response (FIR) configuration. An analog input signal 12 is received at an analog to digital converter (ADC) 14 to provide a digital signal at discrete sample intervals. The analog input signal 12 may be transmitting encoded symbols representing information in a noisy communication channel with distortion. The ADC 14 may sample the analog input signal at discrete sample intervals corresponding with an inter-symbol temporally spacing, or fractions thereof.

In a feed forward portion of the digital filter 10, on each discrete sample interval, the digital signal from the present discrete sample interval is provided to a multiplication circuit 20 to be scaled by coefficient $c_0$, and signal taps at two previous sample intervals (i.e., the digital samples from the two previous discrete sample intervals delayed by delay circuits 16) are provided to multiplication circuits 20 to be scaled by coefficients $c_2$ and $C_4$, respectively. The outputs of the three multiplication circuits are then additively combined at a summing circuit 22 as feed forward components of an equalized signal.

The coefficients $c_0$, $c_2$ and $C_4$ are typically updated to approximate a least mean square error (LMS) filter for the particular FIR filter configuration. A limiting circuit 30 may provide a bi-level detection of symbols from the equalized signal output of the summing circuit 22, and differencing circuit 28 provides a difference between the filtered output and the detected symbol as an "error." A limiting circuit 26 provides a sign of the error to each of three multiplication circuits 25 for updating the coefficients $c_0$, $c_2$ and $C_4$. Each of the multiplication circuits 25 multiplies the sign of the error with the sign of a corresponding signal tap of the digital signal (as detected at a limiting circuit 18) and a sample and hold circuit 24 generates an updated coefficient.

In a feedback portion of the digital filter 10, an output data signal 38 from the detector circuit 30 is tapped at delay circuit 32 and combined with the sign of the error generated by limiting circuit 26. The result is integrated at sample and hold circuit 34 to generate a feedback coefficient. A multiplication circuit 31 then scales the output of delay circuit 32 by the feedback coefficient to provide a feedback component of the equalized signal output at summing circuit 22.

FIG. 2 shows a conventional implementation of a feed back portion of the digital filter 10. An equalized signal 42 is combined with a scaled output of flip-flop circuit 46 (i.e., scaled by a feedback coefficient 54) at summing circuit 44. The result is stored in the flip-flop circuit 46 and provided as an output 48 on pulses of a clock signal 50. The output 48 may then be additively combined with feed forward components of the equalized signal.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION

Figure 1:
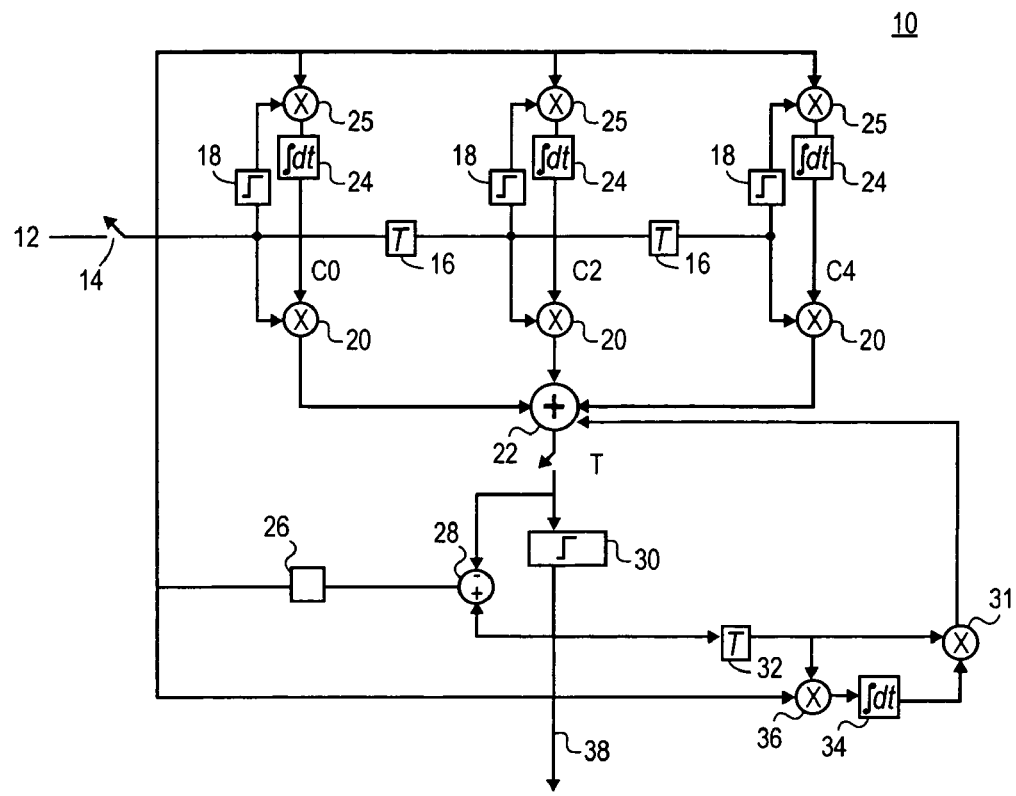
FIG. 1 shows a conventional digital filter employing a finite impulse response (FIR) configuration.
Figure 2:
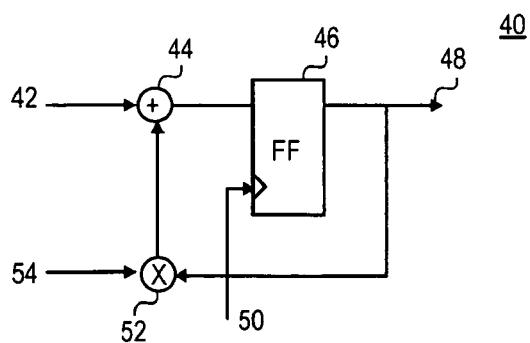
FIG. 2 shows a conventional implementation of a feedback portion of a FIR filter.

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "an embodiment" in various places throughout this specification are not necessarily all referring to the same embodiment. Furthermore, the particular features, structures, or characteristics may be combined in one or more embodiments.

"Machine-readable" instructions as referred to herein relates to expressions which may be understood by one or more machines for performing one or more logical operations. For example, machine-readable instructions may comprise instructions which are interpretable by a processor compiler for executing one or more operations on one or more data objects. However, this is merely an example of machine-readable instructions and embodiments of the present invention are not limited in this respect.

"Machine-readable medium" as referred to herein relates to media capable of maintaining expressions which are perceivable by one or more machines. For example, a machine readable medium may comprise one or more storage devices for storing machine-readable instructions or data. Such storage devices may comprise storage media such as, for example, optical, magnetic or semiconductor storage media. However, this is merely an example of a machine-readable medium and embodiments of the present invention are not limited in this respect.

"Logic" as referred to herein relates to structure for performing one or more logical operations For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions However, these are merely examples of structures which may provide logic and embodiments of the present invention are not limited in this respect.

A "receiver" as referred to herein relates to a system, apparatus or circuit to process a signal received from a transmission medium. For example, a receiver may comprise circuitry or logic to extract information encoded in a signal received from a transmission medium. However, this is merely an example of a receiver and embodiments of the present invention are not limited in this respect.

An "analog signal" as referred to herein relates to a signal having a value that may change continuously over a time interval. For example, an analog signal may be associated with one or more voltages where each voltage may change continuously over a time interval. An analog signal may be sampled at discrete time intervals to provide a "digital signal" where one or more discrete signal values are associated with each discrete time interval and, unlike an analog signal, do not change continuously between such discrete time intervals. However, this is merely an example of an analog signal as contrasted from a digital signal and embodiments of the present invention are not limited in these respects.

A "symbol" as referred to herein relates to a representation of information encoded in a signal transmitted in a transmission medium. For example, a symbol may represent a "one" or "zero" in a single information "bit" or multiple bits according to a symbol mapping defined for transmitting information in a communication channel. Accordingly, a transmitted symbol may be associated with a "symbol value" as defined by the symbol mapping. Upon receipt of a signal transmitting an encoded symbol, a receiver may extract an "estimated symbol value" to represent an estimate of the symbol value of the actual symbol transmitted by the signal in the communication channel. In the presence of noise and distortion in the communication channel, an estimated symbol value may deviate from the symbol value of the actual symbol transmitted by an "error." For a symbol value characterized as having a magnitude, an error associated with an estimated symbol value may be associated with a "sign" to represent whether the estimated symbol value exceeds or does not exceed the symbol value of the actual symbol transmitted. An "error signal" may be generated to provide information indicative of at least one aspect of a detected error. Such an error signal may include, for example, a sign of an error or a magnitude expressing a difference between a measured signal and an actual signal.

Symbols transmitted in a signal may be temporally spaced on "symbol intervals" such that during each distinct symbol interval the signal may transmit a corresponding symbol. An "equalized signal" as referred to herein relates to a signal that has been conditioned or processed. For example, a signal received from a communication channel in the presence of noise and distortion may be processed to enable or improve the detection of symbols being transmitted in the received signal. However, this is merely an example of an equalized signal and embodiments of the present invention are not limited in these respects.

A signal may be "tapped" to provide signal taps or delayed versions of a signal to be processed. A "multi-tap filter" as referred to herein relates to circuitry or logic to process a signal by individually processing the signal at distinct signal taps and combining the individually processed signal taps to provide an equalized signal. For example, a multi-tap filter may comprise one or more delay elements to generate one or more delayed versions of the signal. An amplitude of each of the signal taps may then be scaled by a corresponding "coefficient." The scaled versions of the signal may then be combined to provide a filtered output signal. However, this is merely an example of a multi-tap filter and embodiments of the present invention are not limited in these respects.

A "correlation signal" as referred to herein relates to a result of a combination of two or more signals A correlation signal may be the result of a multiplication of two or more signals, or a result of a logical operation on the two or more signals as inputs. In one particular example, a correlation signal may be the result of a combination of an error signal and a data signal. However, this is merely an example of a correlation signal and embodiments of the present invention are not limited in these respects.

"Inter-symbol timing information" as referred to herein relates to information that indicates the timing of a signal transmitting encoded symbols at set symbol intervals. Such inter-symbol timing information may be transmitted in a clock signal having a period that is synchronized with a period of the symbol intervals in the signal transmitting the encoded symbols. However, this is merely an example of inter-symbol timing information and embodiments of the present invention are not limited in this respect.

A "clock and data recovery circuit" as referred to herein relates to a circuit that is capable of detecting symbols encoded in a signal and timing information. For example, a clock and data recovery circuit may detect symbols in an equalized signal and inter-symbol timing information that is synchronized to symbol intervals in the signal. The clock and data recovery circuit may then generate a clock signal that is synchronized with the inter-symbol timing information. However, this is merely an example of a clock and data recovery circuit, and embodiments of the present invention are not limited in these respects.

Briefly, embodiments of the present invention relate to a system, method and device for generating an equalized signal from an input signal. Symbols in the equalized signal may be detected on each of a sequence of symbol intervals to recover a symbol value in the symbol interval A feedback coefficient may be applied to a symbol value recovered in a previous symbol interval to generate the equalized signal in a current symbol interval. The feedback coefficient may be generated based, at least in part, on an estimated error associated with the equalized signal. The estimated error associated with the equalized output signal from among a plurality of candidate estimated error values. However, this is merely an example embodiment and other embodiments of the present invention are not limited in these respects.

Figure 3:
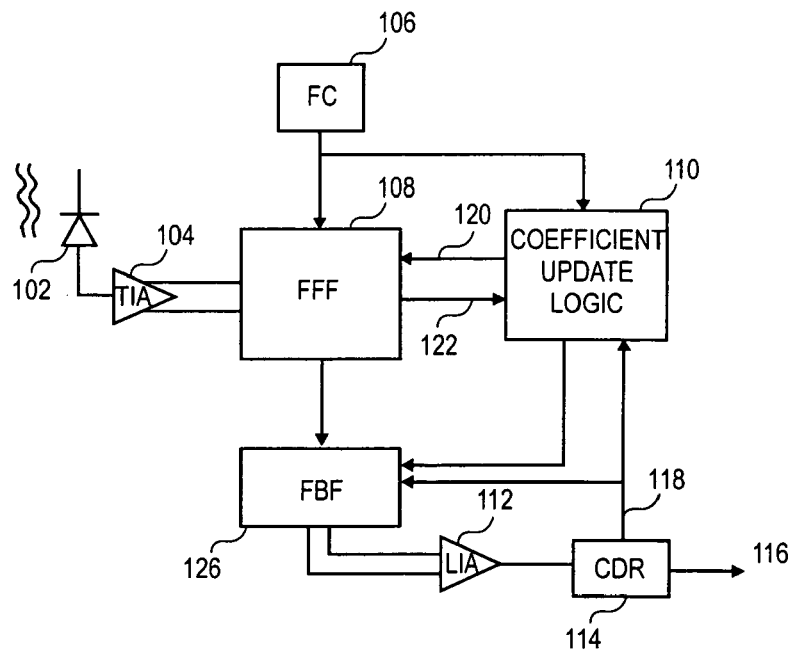
FIG. 3 shows a schematic diagram of a receiver employing a feed forward filter and a feedback filter.

FIG. 3 shows a schematic diagram of a receiver 100 according to an embodiment of the present invention. A transimpedance amplifier 104 may receive a current signal from a photodiode 102 in response to exposure to light energy (e.g., from a fiber optic cable). The transimpedance amplifier 104 may convert the current signal into an input signal expressed as a voltage signal representing the intensity of light energy received at the photodiode 102. The input signal may be processed first by a feed forward filter (FFF) 108 and then by a feedback filter 126 to provide an equalized output signal to a limiting amplifier (LIA) 112. The LIA 112 may then map the equalized output signal to specific voltages in a range of voltages and a clock and data recovery (CDR) circuit 114 may detect symbols on symbol intervals by associating the mapped voltages with symbols, and generate inter-symbol timing information 118.

According to an embodiment, coefficient update logic 110 may provide periodically updated coefficients to the FFF 108 and FBF 126 based upon estimated errors in the detection of symbols from the equalized signal and the inter-symbol timing information 118. A functional controller (FC) 106 may initialize coefficients in the FFF 108, FBF 126 and the coefficient update logic 110 at startup.

According to an embodiment, the FC 106 may control initial loop operation by disabling any dynamic operation of the coefficient update logic 110 and force the coefficients of FFF 108 to predetermined values. For example, the FC 106 may detect a dynamic condition (e.g., start up) and set the coefficients of the FFF 108 to the predetermined values. The FC 106 may then inhibit the coefficient update logic 110 from updating the coefficients from the predetermined values for a time period. In one embodiment, the FC 106 may enable the coefficient update logic 110 to update the coefficients in response to recovery of the inter-symbol timing information by the CDR circuit 114. Alternatively, the FC 106 may enable the coefficient update logic 110 to update the coefficients following a duration based upon an estimated time for CDR circuit 114 to recover the inter-symbol timing information.

While the receiver 100 is shown receiving an analog input signal from a photodiode and transimpedance amplifier, it should be understood that the architecture of receiver 100 may be adapted for processing an input signal from different transmission media. For example, other embodiments may be adapted for processing an analog input signal received as a differential signaling pair signal over unshielded twisted wire pair cabling or over a device to device interconnection formed in a printed circuit board. Other embodiments may be adapted to reading data from high density storage devices (e.g., optical storage media) to enable increased data storage density by equalizing distortion from the dense packing of bits on the high density devices. However, these are merely examples of how a receiver may be implemented for recovering information from a signal and embodiments of the present invention are not limited in these respects.

The receiver 100 may be included as part of an optical transceiver (not shown) to transmit or receive optical signals in an optical transmission medium such as fiber optic cabling. The optical transceiver may modulate a transmitted signal or demodulate a received signal 112 according to any optical data transmission format such as, for example, wave division multiplexing wavelength division multiplexing (WDM) or multi-amplitude signaling (MAS). For example, a transmitter portion of the optical transceiver may employ WDM for transmitting multiple "lanes" of data in the optical transmission medium.

The FFF 108 and LIA 112 may form a physical medium dependent (PMD) section of the receiver 100. Such a PMD section may also provide power from a laser driver circuit (not shown) to a laser device (not shown). The CDR circuit 114 may be included in a physical medium attachment section coupled to the PMD section. Such a PMA section may also include de-multiplexing circuitry (not shown) to recover data from a conditioned signal received from the PMD section, multiplexing circuitry (not shown) for transmitting data to the PMD section in data lanes, and a serializer/deserializer (Serdes) for serializing a parallel data signal from a layer 2 section (not shown) and providing a parallel data signal to the layer 2 section 108 based upon a serial data signal provided by the CDR circuit 114.

According to an embodiment, the layer 2 section may comprise a media access control (MAC) device coupled to the PMA section at a media independent interface (MII) as defined IEEE Std. 802.3ae-2002, clause 46. In other embodiments, the layer 2 section may comprise forward error correction logic and a framer to transmit and receive data according to a version of the Synchronous Optical Network/Synchronous Digital Hierarchy (SONET/SDH) standard published by the International Telecommunications Union (ITU). However, these are merely examples of layer 2 devices that may provide a parallel data signal for transmission on an optical transmission medium, and embodiments of the present invention are not limited in these respects.

The layer 2 section may also be coupled to any of several input/output (I/O) systems (not shown) for communication with other devices on a processing platform. Such an I/O system may include, for example, a multiplexed data bus coupled to a processing system or a multi-port switch fabric. The layer 2 section may also be coupled to a multi-port switch fabric through a packet classification device. However, these are merely examples of an I/O system which may be coupled to a layer 2 device and embodiments of the present invention are not limited in these respects.

Figure 4:
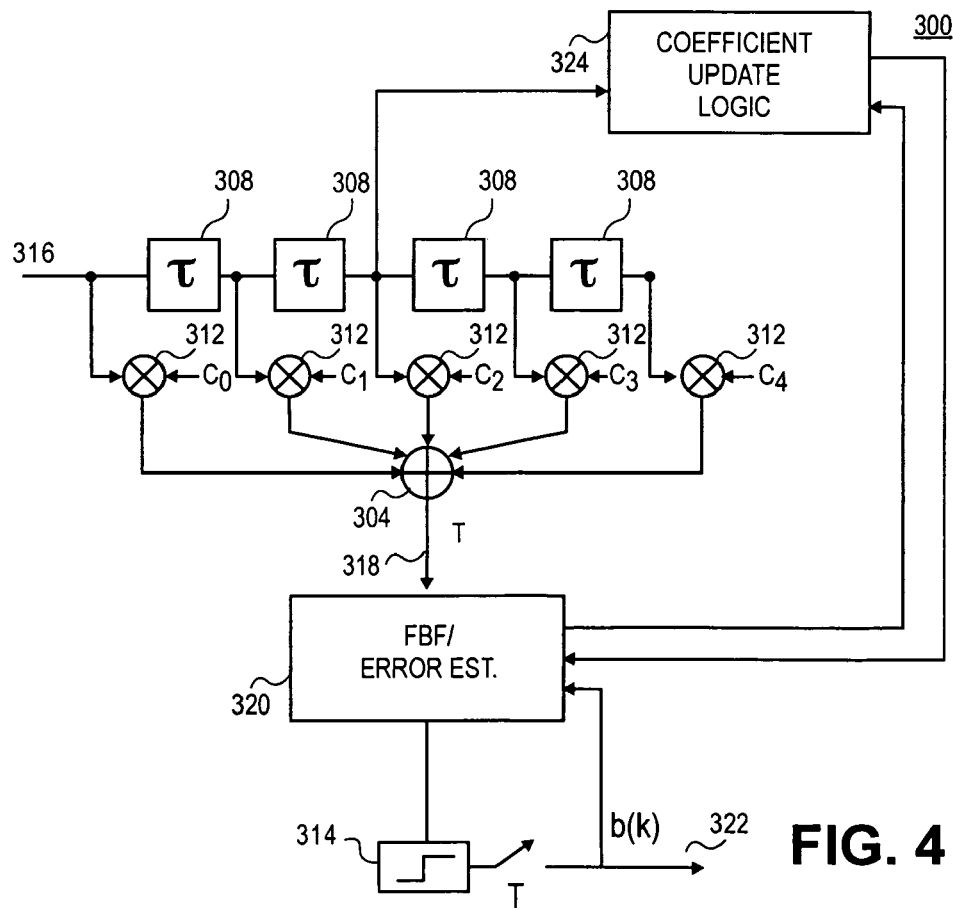
FIG. 4 shows a schematic diagram of a multi-tap filter according to an embodiment of the receiver shown in FIG. 3.

FIG. 4 shows a schematic diagram of a multi-tap filter 300 according to an embodiment of the receiver 200 shown in FIG. 3. Each of a plurality of delayed versions or signal taps of an input signal received on terminal 316 may be generated by delay circuits 308 and scaled by a corresponding feed forward coefficient $c_n$ at a corresponding multiplication circuit 312. The analog delay circuits 308 may be formed as described in U.S. patent application Ser. Nos. 10/741,001, and 10/741,044 entitled "Analog Delay Circuit," incorporated herein by reference. A summing circuit 304 may additively combine the outputs of the multiplication circuits 312 to generate an intermediate equalized signal 318 from a feed forward portion of the multi-tap filter 300. In the presently illustrated embodiment, coefficient update logic 324 may update each feed forward coefficient $c_0$ through $C_4$ as follows:

$$c_j(k+1) = c_j(k) + \Delta_j \times sgn[\epsilon(k)] \times sgn[a_j(k)]$$

where:

$c_j(k+1)$=the feed forward coefficient to scale the jth signal tap the input signal in the future period k+1;

$c_j(k)$=the feed forward coefficient to scale the jth signal tap of the input signal in the current period k;

$sgn[\epsilon(k)]$=the sign of the estimated error of the equalized signal in the present period k;

$sgn[a_j(k)]$=the sign of the signal tap of the input signal to be scaled by the coefficient $c_j(k)$ in the present period k; and $\Delta_j$=a predetermined constant.

According to an embodiment, the intermediate equalized signal 318 may be received at a feedback filter (FBF) and error generation circuit 320 to provide an equalized signal to a limiting circuit 314. The FBF and error generation circuit 320 may generate the sign of the estimated error of the equalized signal, $sgn[\epsilon(k)]$, in period k based upon the equalized signal and the inter-symbol timing information provided in a clock signal Clk(t). The coefficient update logic 324 may also determine a feedback coefficient $c_{FB}(k)$ to be applied to a symbol value recovered in a present period, b(k), for generating a feedback component as follows:

$$c_{FB}(k+1) = c_{FB}(k) + \Delta_{FB} \times sgn[\epsilon(k)] \times sgn[b(k)]$$

The feedback component may be additively combined with the intermediate equalized signal from summing circuit to provide the recovered symbol value b(k+1) in a future period.

Figure 5:
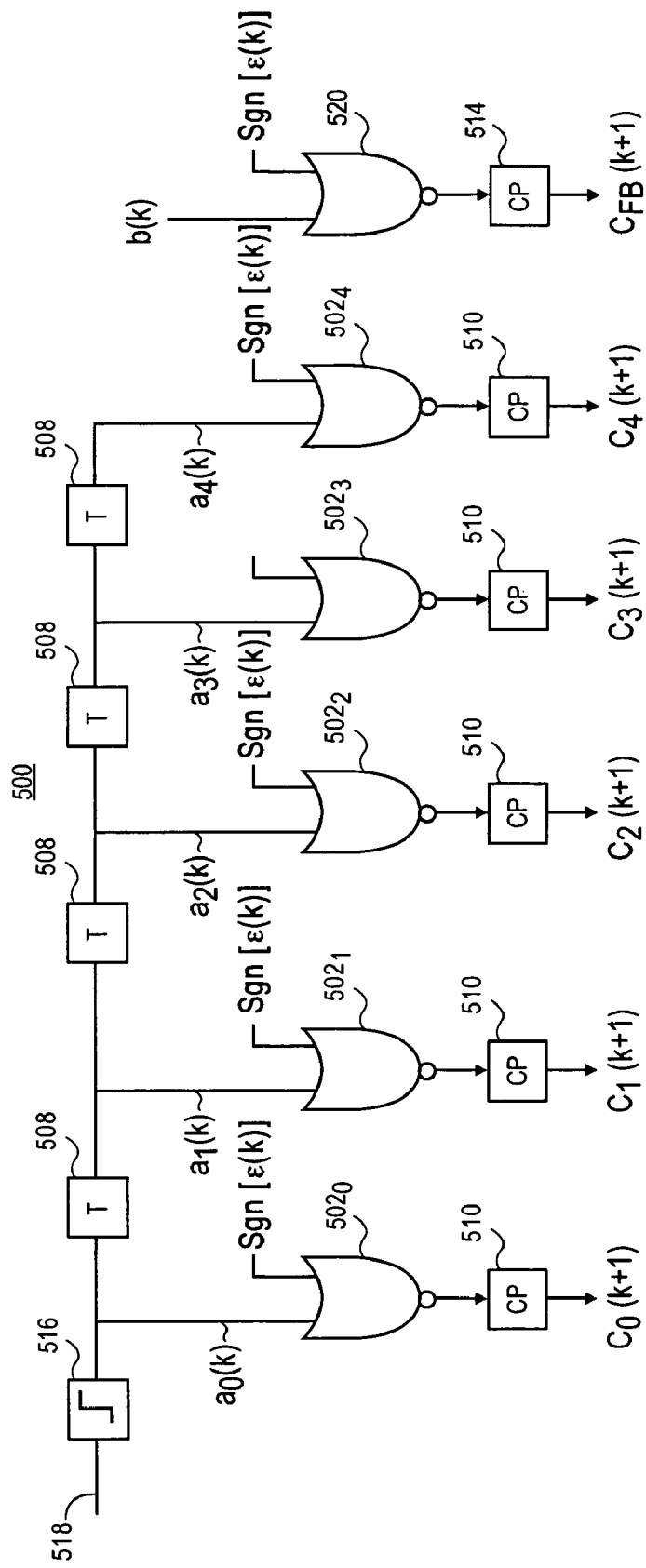
FIG. 5 shows a schematic diagram of a circuit to update coefficients according to an embodiment of the multi-tap filter shown in FIG. 4.

FIG. 5 shows a schematic diagram of a circuit 500 to update coefficients of a multi-tap filter according to an embodiment of the coefficient update logic 324 shown in FIG. 4. According to an embodiment, a signal tap of an input signal 518 is received at a limiting circuit 508. The limited signal is then tapped at successive delay elements 508 to provide a sign of a corresponding signal tap $a_n(k)$ to each of a plurality of NXOR gates 502. Each NXOR gate 502 also receives sgn [$\epsilon(k)$] and employs signed logic to generate an output $\Delta_j \times$sgn [$\epsilon(k) \times$]$\times$sgn [$a_j(k)$] on intervals according to the inter-symbol timing information. At one terminal of each NXOR gate 502, the NXOR gate 502 may receive the sign of the error of the equalized signal in the present period k, sgn[$\epsilon(k)$], as determined by the FBF and error generation circuit 320 shown in FIG. 4. At the other terminal of each NXOR gate 502, the NXOR gate 502 may receive the sign of the version of the analog input signal to be scaled by a corresponding coefficient $c_j(k)$ in the present period k, sgn [$a_j(k)$]. On a coefficient update interval, each charge pump circuit 510 may receive an output of a corresponding NXOR gate 502, sgn[$\epsilon(k)$]$\times$sgn[$a_j(k)$], scale the output by $\Delta_j$, and additively combine with a corresponding coefficient (used to scale the jth signal tap of the analog input signal in the present period k, $c_j(k)$) and provide $c_j(k+1)$. Similarly, an NXOR gate 520 may provide sgn[$\epsilon(k)$]$\times$sgn [$b(k)$] to a charge pump circuit 514 to update a feedback coefficient $c_{FB}(k)$ by $\Delta_{FB}$ in a current period to $c_{FB}(k+1)$ for a future period.

Figure 6:
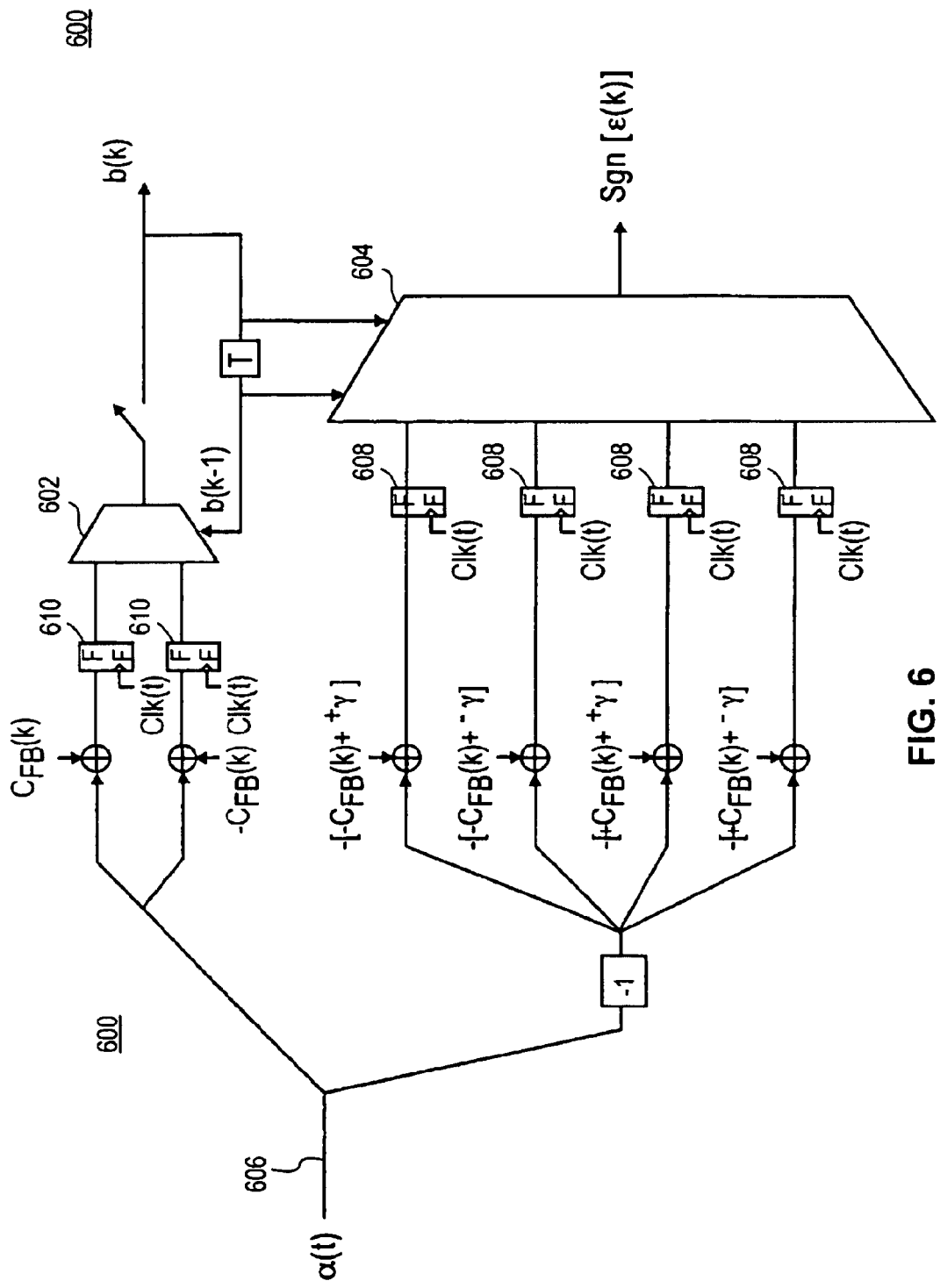
FIG. 6 shows a schematic diagram of a circuit to generate an error signal and an equalized output signal according to an embodiment of the multi-tap filter shown in FIG. 4.

FIG. 6 shows an FBF and error generation circuit 600 according to an embodiment of the FBF and error generation circuit 320 shown in FIG. 4. The FBF and error generation circuit 320 may generate sgn[$\epsilon(k)$] and b(k) based on an intermediate equalized signal $\alpha(t)$ received from the feed forward portion of the multi-tap filter 300 (e.g., from the output of summing circuit 304). In the illustrated embodiment, an input signal may encode information in symbol intervals as bi-level symbols (e.g., having one of two voltages in a symbol period) where a symbol may encode information (e.g., a "0" or "1") mapped to an associated value of $^+\gamma$ or $^-\gamma$. Accordingly, b(k) may take on the value of $^+\gamma$ or $^-\gamma$. However, this is merely an example embodiment and other embodiments may map information in a symbol interval to a symbol from among three or more levels.

According to an embodiment, the FBF and error generation circuit 600 may select a recovered symbol value signal in a present period b(k) from among a plurality of candidate symbol values based upon the intermediate equalized signal $\alpha(t)$ and a symbol value recovered in a previous period b(k−1). A multiplexer (MUX) circuit 602 receives two inputs, each input being based upon the intermediate equalized signal $\alpha(t)$ and the feedback coefficient $c_{FB}(k)$. The first input is based upon a first composite signal comprising the intermediate equalized signal $\alpha(t)$ added to $c_{FB}(k)$ to provide a first candidate equalized output signal. The second input is based upon a second composite signal comprising $c_{FB}(k)$ subtracted from the intermediate equalized signal $\alpha(t)$ to provide a second candidate equalized output signal. Each of the first and second candidate equalized output signals are received at a corresponding flip-flop circuit 610. On the leading edge of pulses of clock signal Clk(t), the flip-flop circuits 610 provide the sign of the first and second candidate equalized output signals as inputs to the MUX circuit 602. Based upon the recovered symbol value of the previous period b(k−1), the MUX circuit 602 may output either the sign of the first candidate equalized output signal or the sign of the second equalized output signal as the symbol value recovered in the present period b(k).

According to an embodiment, the FBF and error generation circuit 600 may also select the sign of the estimated error of the equalized output signal in a present period sgn [$\epsilon(k)$] from among a plurality of candidate error signals based upon the symbol value recovered in a previous period b(k−1). A MUX circuit 604 receives four inputs, each input being based upon the intermediate equalized signal $\alpha(t)$ and the feedback coefficient $c_{FB}(k)$, and either the positive symbol value $^+\gamma$ or negative symbol value $^-\gamma$. Each of the four inputs represents a candidate estimate of the error $\epsilon(k)$ associated with the symbol value recovered in the present period b(k). As such, each of the four candidates represents a difference between a candidate equalized output signal ($\alpha(t)+/-c_{FB}(k)$) and a symbol value (the positive symbol value $^+\gamma$ or negative symbol value $^-\gamma$).

Each of the four candidate estimates of the error $\epsilon(k)$ is received as an input to a corresponding flip-flop circuit 608. On the leading edge of pulses of clock signal Clk(t), each flip-flop circuit 608 provides the sign of a corresponding four candidate estimate of the error $\epsilon(k)$ in the present period as an input to the MUX circuit 604. Based upon the symbol values recovered in the current period b(k) and recovered in the previous period b(k−1), the MUX circuit 604 may output the sign of a selected candidate estimate of the error as the sign of the estimated error in the present period sgn[$\epsilon(k)$]. The following table illustrates logic in the MUX circuit 602 to select an equalized output signal to generate b(k) from among a plurality of candidate equalized output signals based upon b(k−1), and logic in the MUX circuit 604 to select an error signal from among a plurality of candidate error signals based on b(k) and b(k−1):

| b(k) | b(k − 1) | Equalized output signal selected at MUX circuit 602 | $\epsilon(k)$ selected at MUX circuit 604 |
| --- | --- | --- | --- |
| $^+\gamma$ | $^+\gamma$ | $\alpha(t) + c_{FB}(k)$ | $-\alpha(t) - [c_{FB}(k) + {}^+\gamma]$ |
| $^+\gamma$ | $^-\gamma$ | $\alpha(t) - c_{FB}(k)$ | $-\alpha(t) - [-c_{FB}(k) + {}^+\gamma]$ |
| $^-\gamma$ | $^+\gamma$ | $\alpha(t) + c_{FB}(k)$ | $-\alpha(t) - [c_{FB}(k) + {}^-\gamma]$ |
| $^-\gamma$ | $^-\gamma$ | $\alpha(t) - c_{FB}(k)$ | $-\alpha(t) - [-c_{FB}(k) + {}^-\gamma]$ |

Figure 7:
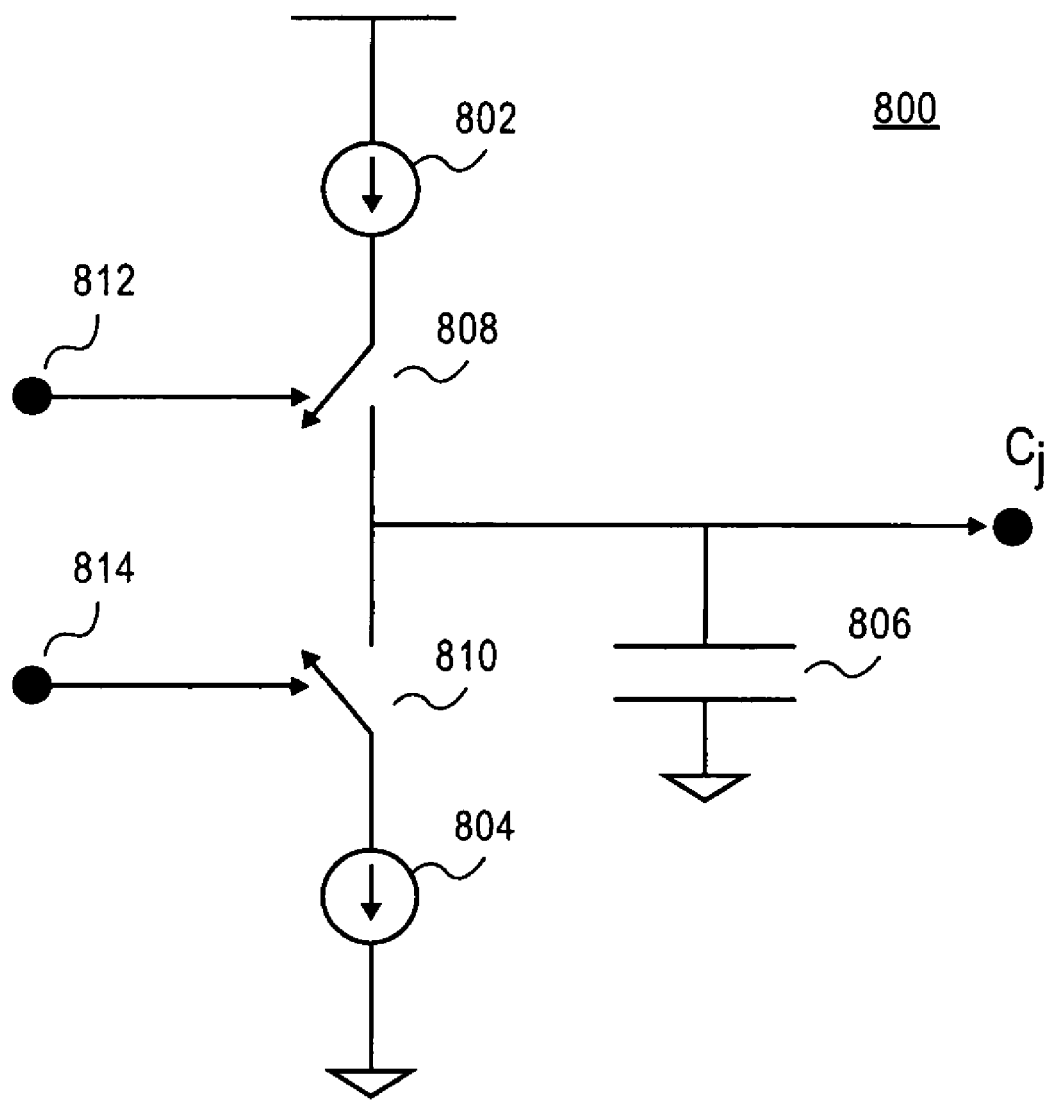
FIG. 7 shows a schematic diagram of a charge pump circuit according to an embodiment of the circuit shown in FIG. 5.

FIG. 7 shows a schematic diagram of a charge pump circuit 800 according to an embodiment of a charge pump circuit 510 or 514 circuit shown in FIG. 5 According to an embodiment, switch 808 may couple a current source 802 to add charge to a capacitor 806 in response to a positive value for sgn[$\epsilon(k)$]$\times$sgn[$a_j(k)$] provided by a charge pump 502. Similarly, a switch 810 may couple a current source 804 to remove charge to a capacitor 806 in response to a negative value for sgn[$\epsilon(k)$]$\times$sgn[$a_j(k)$] provided by the charge pump 502. The resulting voltage of capacitor 806 may then represent the updated coefficient $c_j(k+1)$.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method comprising:
    detecting symbols in an equalized output signal on each of a sequence of symbol intervals to recover a symbol value in the symbol interval;
    applying a feedback coefficient to a symbol value recovered in a previous symbol interval to generate the equalized output signal in a current symbol interval;
    generating the feedback coefficient based, at least in part, on an estimated error associated with the equalized output signal; and
    selecting the estimated error associated with the equalized output signal from among a plurality of candidate estimated error values based, at least in part, on the symbol value recovered in the previous symbol interval and a symbol value recovered in the current symbol interval;
    wherein the above steps are performed by a receiver.

2. The method of claim 1, wherein the method further comprises selecting the equalized output signal in the current symbol interval from among a plurality of candidate equalized output signals based, at least in part, upon a symbol value recovered in a previous symbol interval, each candidate equalized output signal being based, at least in part, on the feedback coefficient.

3. The method of claim 2, wherein the method further comprises generating each of the candidate estimated error values based, at least in part, upon a difference between an associated candidate equalized output signal and a symbol value.

4. The method of claim 2, the method further comprising:
    applying of each of a plurality of feed forward coefficients to a corresponding one of a plurality of signal taps of an input signal to generate a product associated with the feed forward coefficient;
    combining the products associated with the feed forward coefficients to generate the intermediate equalized signal; and
    generating each of the candidate equalized output signals based, at least in part, on a sum of the intermediate equalized signal and a scalar multiple of the feedback coefficient.

5. The method of claim 2, the method further comprising:
    applying each of a plurality of feed forward coefficients to a corresponding one of a plurality of signal taps of an input signal to generate an intermediate equalized signal; and
    generating each of the candidate equalized output signals based, at least in part, on a sum of the intermediate equalized signal and a scalar multiple of the feedback coefficient.

6. The method of claim 5, the method further comprising updating at least one of the feed forward coefficients based, at least in part, upon the selected estimated error associated with the equalized output signal.

7. The method of claim 1 further comprising generating a feedback coefficient for a future symbol interval based, at least in part, on the estimated error associated with the equalized output signal in the current symbol interval and the symbol value recovered in the current symbol interval.

8. The method of claim 7 wherein generating the feedback coefficient for a future symbol interval comprises using an inverted exclusive OR gate.

9. The method of claim 7 wherein generating the feedback coefficient for a future symbol interval comprises multiplying the estimated error associated with the equalized output signal in the current symbol interval and the symbol value recovered in the current symbol interval.

10. A receiver comprising:
    a detector to detect symbols in an equalized output signal on each of a sequence of symbol intervals to recover a symbol value in the symbol interval;
    a multi-tap filter to apply each of a plurality of feed forward coefficients to a corresponding signal tap of an input signal to generate an intermediate equalized signal, and to apply a feedback coefficient to a symbol value recovered in a previous symbol interval to generate the equalized output signal in a current symbol interval;
    logic to generate the feedback coefficient based, at least in part, on an estimated error associated with the equalized output signal; and
    logic to select the estimated error associated with the equalized output signal from among a plurality of candidate estimated error values based, at least in part, on the symbol value recovered in the previous symbol interval and a symbol value recovered in the current symbol interval.

11. The receiver of claim 10, wherein the receiver further comprises logic to select the equalized output signal in the current symbol interval from among a plurality of candidate equalized output signals based, at least in part, upon a symbol value recovered in a previous symbol interval, each candidate equalized output signal being based, at least in part, on the feedback coefficient.

12. The receiver of claim 11, wherein the receiver further comprises logic to generate each of the candidate estimated error values based, at least in part, upon a difference between an associated candidate equalized output signal and a symbol value.

13. The receiver of claim 11, wherein the multi-tap filter comprises logic to generate each of the candidate equalized output signals based, at least in part, on a sum of the intermediate equalized signal and a scalar multiple of the feedback coefficient.

14. The receiver of claim 13, wherein multi-tap filter signal further comprises:
    a multiplication circuit for each of the feed forward coefficients to generate a product associated with the feed forward coefficient; and
    a summing circuit to combine the products associated with the feed forward coefficients to generate the intermediate equalized signal.

15. The receiver of claim 14 wherein the multiplication circuit for each of the feedforward coefficients comprises an inverted exclusive OR gate.

16. The receiver of claim 13, wherein the receiver further comprises logic to update at least one of the feed forward coefficients based, at least in part, upon the selected estimated error associated with the equalized output signal.

17. The receiver of claim 10, the receiver further comprising:
    logic to set the feed forward coefficients to predetermined values in response to detection of a dynamic condition; and
    logic to inhibit update of the feed forward coefficients from the predetermined values for a duration.

18. The receiver of claim 17, the receiver further comprising logic to enable update of the feed forward coefficients from the predetermined values in response to recovery of inter-symbol timing information from the equalized output signal.

19. The receiver of claim 17, the receiver further comprising logic to enable update of the feed forward coefficients from the predetermined values following a duration based upon an estimated time to recover inter-symbol timing information from the equalized output signal.

20. The receiver of claim 10 further comprising logic to generate a feedback coefficient for a future symbol interval based, at least in part, on the estimated error associated with the equalized output signal in the current symbol interval and the symbol value recovered in the current symbol interval.

21. The receiver of claim 20 wherein the logic to generate the feedback coefficient for the future symbol interval comprises an inverted exclusive OR gate.

22. A system comprising:
- a receiver adapted to process an input signal from a transmission medium, the receiver comprising:
  - a data recovery circuit comprising to detect symbols in an equalized output signal on each of a sequence of symbol intervals and to recover a serial data signal comprising a symbol value in each symbol interval;
  - a multi-tap filter to apply each of a plurality of feed forward coefficients to a corresponding signal tap of an input signal to generate an intermediate equalized signal, and to apply a feedback coefficient to a symbol value recovered in a previous symbol interval to generate the equalized output signal in a current symbol interval;
  - logic to generate the feedback coefficient based, at least in part, on an estimated error associated with the equalized output signal; and
  - logic to select the estimated error associated with the equalized output signal from among a plurality of candidate estimated error values based, at least in part, on the symbol value recovered in the previous symbol interval and a symbol value recovered in the current symbol interval; and
- a deserializer to provide a parallel data signal in response to the serial data signal.

23. The system of claim 22, wherein the system further comprises:
- a photodiode coupled to an optical transmission medium; and
- a transmission amplifier to generate the input signal in response to a current from the photodiode.

* * * * *